United States Patent [19]

Ichise et al.

[11] Patent Number: 4,717,891

[45] Date of Patent: Jan. 5, 1988

[54] PHASE LOCKED LOOP CIRCUIT HAVING TEMPERATURE COMPENSATED VCO CONTROL VOLTAGE

[75] Inventors: Toshihiko Ichise, Kanagawa; Tsuguhide Sakata, Tokyo; Hisashi Kawai, Kanagawa, all of Japan

[73] Assignee: Canon Kabushiki Kaisha, Tokyo, Japan

[21] Appl. No.: 876,972

[22] Filed: Jun. 20, 1986

[30] Foreign Application Priority Data

Jun. 25, 1985 [JP] Japan ............................ 60-136993

[51] Int. Cl.⁴ ............................................ H03L 7/18
[52] U.S. Cl. ........................................ 331/17; 331/8; 331/27; 307/516
[58] Field of Search ................... 331/17, 8, 15, 25, 27

[56] References Cited

U.S. PATENT DOCUMENTS

| | | | |
|---|---|---|---|
| 3,983,506 | 9/1976 | Rettinger, Jr. et al. | 331/17 |
| 4,031,483 | 6/1977 | Formeister | 331/17 |
| 4,206,420 | 6/1980 | Querry et al. | 331/17 X |
| 4,454,483 | 6/1984 | Baylor | 331/17 |
| 4,506,232 | 3/1985 | Thompson | 331/17 X |

Primary Examiner—Siegfried H. Grimm
Attorney, Agent, or Firm—Toren, McGeady and Associates

[57] ABSTRACT

A phase locked loop circuit including a controllable oscillator, a phase detector for detecting a phase difference between an output signal of the oscillator and an input signal, and a control signal generator for generating a control signal for controlling an oscillation frequency of the oscillator on the basis of the output of the phase detector. The phase locked loop circuit also includes a feedback circuit for controlling a level of the control signal on the basis of a DC level thereof. The feedback circuit is able to temperature compensate for changes in the oscillator output signal thereby keeping the lock range of the phase locked loop circuit constant against variations in temperature.

11 Claims, 11 Drawing Figures

FIG.1
PRIOR ART
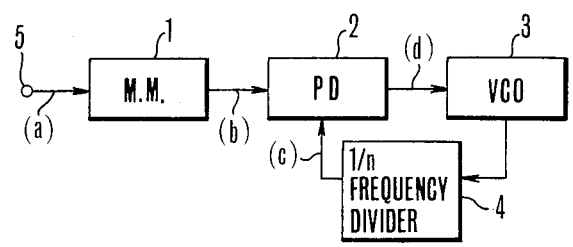
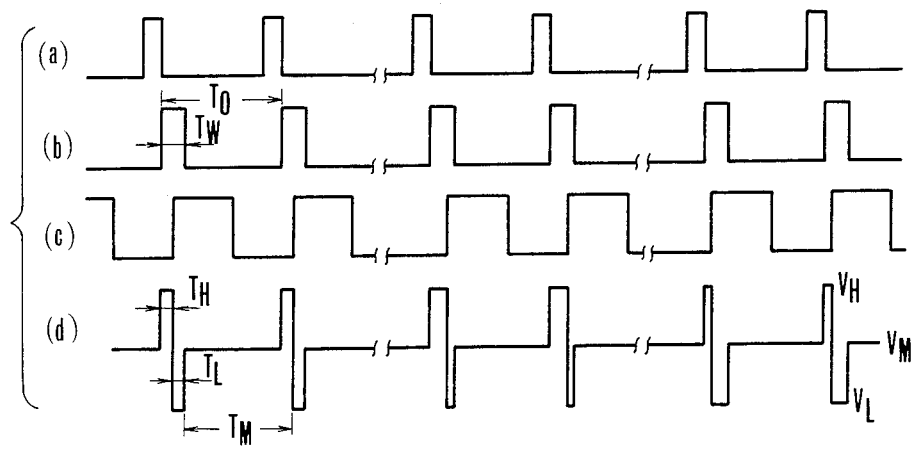
FIG.2
PRIOR ART

FIG.5
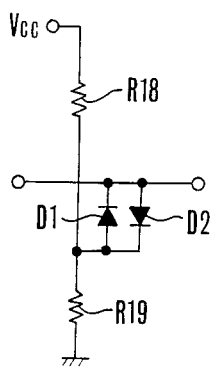
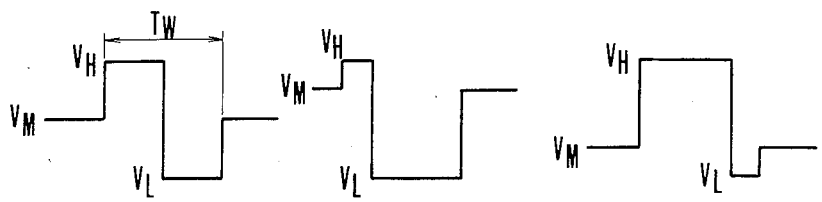
FIG.6(A)  FIG.6(B)  FIG.6(C)
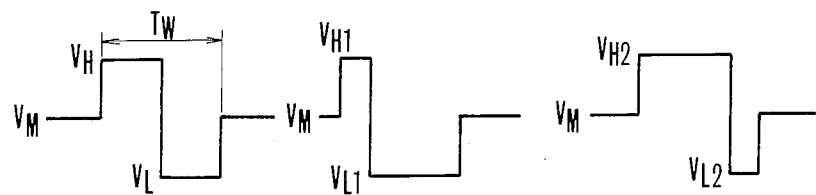
FIG.7(A)  FIG.7(B)  FIG.7(C)

PHASE LOCKED LOOP CIRCUIT HAVING TEMPERATURE COMPENSATED VCO CONTROL VOLTAGE

BACKGROUND OF THE INVENTION

1. Field of the Invention

This invention relates to a phase locked loop circuit (hereinafter referred to as PLL circuit), and, more particularly, to improvement in the characteristic thereof.

2. Description of the Related Art

Heretofore analog type PLL circuits have been often employed in devices of varied kinds. FIG. 1 of the accompanying drawings is a block diagram showing, by way of example, the arrangement of the conventional PLL circuit. The illustration includes a monostable multivibrator 1 (hereinafter referred to as MM); a phase comparator 2 (hereinafter referred to as PD) which is capable of producing an output at three different levels including a high level, a medium level and a low level; a voltage controlled oscillator 3 (hereinafter referred to as VCO); a frequency divider 4; and a terminal 5 which is arranged to receive an incoming rectangular wave signal. FIG. 2 is a timing chart showing the waveforms of signals (a) to (d) obtained at various prints in the circuit of FIG. 1. Referring to FIG. 2, the conventional PLL circuit operates as follows: The signal (a), which is of a rectangular waveform, comes from the outside and is applied to the terminal 5. The incoming signal (a) is applied to the MM 1. The MM 1 then supplies the signal (b) of pulse width TW to the PD 2. The PD 2 receives another comparison signal input, which is a signal (c) produced from the frequency divider 4 by down counting the oscillation output of the VCO 3 down to 1/n. The PD 2 compares the phases of these signals (b) and (c) and produces the signal (d). The signal (d) is supplied directly to the VCO 3. The VCO 3 oscillates at three different frequencies FL, FM and FH according to the three different output levels VL, VM and VH of the PD 2. The oscillation output of the VCO 3 is supplied to the frequency divider 4 to be frequency divided into 1/n. The frequency divided output of the VCO 3 is supplied to the comparison input terminal of the PD 2. A closed loop is thus formed.

The conventional PLL is characterized by a quck responsivity derived from inclusion of no low-pass filter within the above-stated closed loop. Further details of the arrangement and the advantages of this prior art PLL circuit are as mentioned in Japanese Laid-Open Patent Application No. SHO 60-84017 and U.S. Pat. application Ser. No. 659,717, filed Oct. 11, 1984, now U.S. Pat. No. 4,626,797, in common assignment herewith, and are, therefore omitted from the following description.

Generally, for obtaining a high speed responsivity and a high degree of stability of the PLL circuit of the above-stated kind, the signal (b), which is the reference input to the PD 2 and to be used for setting the period of control over the VCO 3, cannot be allowed to have a large pulse width TW for the incoming signal. Assuming that the frequency of the incoming signal is fT, 1/fT sec is 63,556 μs in the event of fT=15,734 KHz. The reason for that the pulse width TW cannot be large is as follows: With the output signal (D) of the PD 2 arranged to be supplied directly to the VCO 3 and with the VCO 3 arranged to generate three different frequencies FL, FM and FH, the period of the oscillation frequency FM of the VCO 3, which is the free-running period of the VCO 3, inevitably becomes long. During this free-running period, however, the output frequency sensitivity reacts to the temperature resulting from the temperature characteristic of the VCO 3 at a level VM. This adverse effect of temperature makes the frequency FM instable. The instability of the control input has not only increased the instability of the closed loop of the PLL circuit but also narrowed the phase-lock pull-in range of the conventional PLL circuit.

SUMMARY OF THE INVENTION

This invention is directed to the solution of the above-stated problem of the prior art. It is thus an object of the invention to provide a phase locked loop circuit which is improved in stability.

It is another object of this invention to provide a phase locked loop circuit which is capable of eliminating fluctuation of frequency of the output signal thereof resulting from temperature variations.

It is a further object of this invention to provide a phase locked loop circuit which is capable of keeping the phase lock pull-in range thereof always unvarying.

Under this object, a phase locked loop circuit embodying this invention comprises: a controllable oscillator; phase detecting means for detecting a phase difference between an output signal of the oscillator and an incoming signal; control signal generating means for generating a control signal for controlling the oscillation frequency of the oscillator on the basis of the output of the phase detecting means; and feedback means arranged to control the level of the control signal on the basis on the DC level thereof.

These and further objects and features of this invention will become apparent from the following detailed description of a preferred embodiment thereof taken in connection with the accompanying drawings.

BRIEF DESCRIPTION OF THE DRAWINGS

FIG. 1 is a diagram showing, by way of example, the arrangement of the conventional PLL circuit.

FIG. 2 is a timing chart showing waveforms of signals obtained at various points in the circuit of FIG. 1.

FIG. 5 is a circuit diagram supplementary to the circuit arrangement of FIG. 3.

FIGS. 6(A) to 6(C) and 7(A) to 7(C) are waveform charts respectively showing the operation of the circuit of FIG. 3.

DETAILED DESCRIPTION OF THE PREFERRED EMBODIMENT

Figure 3:
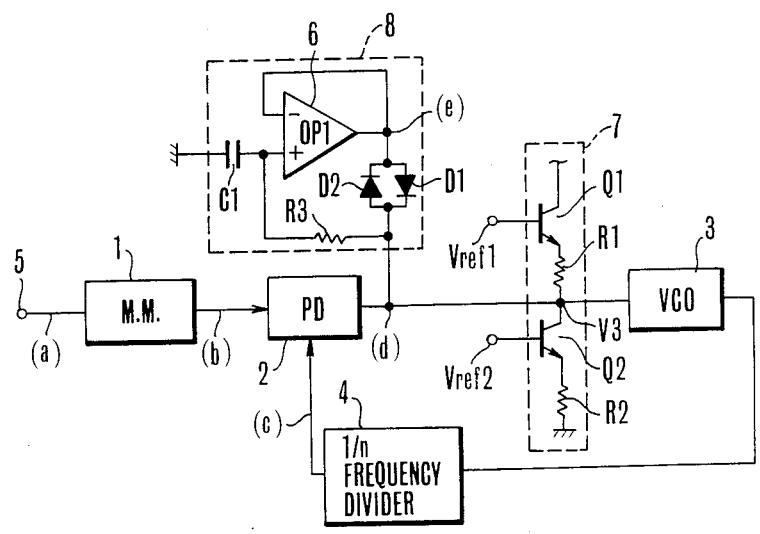
FIG. 3 is a diagram showing the PLL circuit arranged according to this invention as an embodiment thereof.
Figure 4:
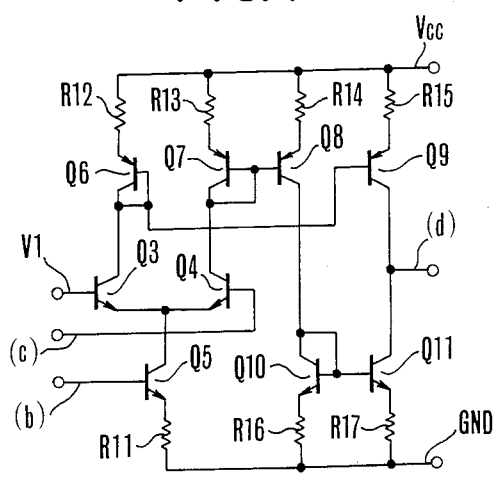
FIG. 4 is a circuit diagram showing, by way of example, the arrangement of a phase comparator included in FIG. 3.

FIG. 3 shows, in block diagram, the arrangement of a PLL circuit as an embodiment of this invention. FIG. 4 shows the details of arrangement of a phase comparison circuit (PD) 2 which is arranged to produce a signal (d) at one of three different levels according to a phase difference between a reference signal (b) and a comparison signal (c). Briefly stated, the PD 2 operates as follows: When the signal (b) produced from a monostable multivibrator (MM) 1 is at a low level, a transistor Q5 turns off. As a result, transistors Q3 and Q4 both turn off. Following this, other transistors Q6, Q7, Q8, Q9, Q10 and Q11 also turn off. Accordingly, a terminal (d) comes to have a voltage determined by a voltage obtained on the output side of the circuit. In case that a circuit, which is arranged as shown in FIG. 5, is connected to the output terminal of the circuit of FIG. 4, for example, the level of the output signal thus obtained becomes R18Vcc/(R18+R19).

When the output signal of the MM 1 is at a high level and that of a frequency divider 4 also at a high level, the transistors Q5 and Q4 turn on. The transistors Q8 and Q11 also turn on. Then, the terminal (d) of FIG. 4 is grounded via a resistor R17. With the circuit of FIG. 5 connected to the circuit of FIG. 4 in that instance, the level of the output signal becomes R18Vcc/(R18+R19)−$V_{D2}$ (wherein $V_{D2}$ represents the forward voltage of a diode D2. In case that the output signal of the MM 1 is at a high level and that of the frequency divider 4 at a low level, the transistors Q5 and Q3 turn on while the transistor Q9 also turns on. Accordingly, the terminal (d) of FIG. 4 is connected via a resistor R15 to a constant voltage Vcc. With the circuit of FIG. 5 connected to the circuit of FIG. 4 in that instance, the level of the output signal becomes R18Vcc/(R18+R19)+$V_{D1}$, wherein $V_{D1}$ represents the forward voltage of a diode D1.

The circuit of FIG. 3 operates as follows: This illustration includes an operational amplifier 6; a DC constant voltage circuit 7 which is arranged to determine the free-running frequency of the VCO 3 and to make temperature compensation for the free-running frequency; a sample-and-hold circuit 8 forming a loop which applies negative feedback to the variations of a conrol voltage resulting from the temperature characteristic of the VCO 3; transistors Q1 and Q2; resistors R1, R2 and R3; diodes D1 and D2; and a capacitor C1. With the PLL circuit arranged in this manner, if the sample-and-hold circuit 8 is excluded from the circuit arrangement and if the frequency characteristic of the VCO 3 has some negative temperature coefficient, the constant voltage circuit 7 is required to have a temperature coefficient for compensating it. This temperature coefficient is as discussed below:

Assuming that a current I1 is set for the transistor Q2, the DC level V3 of the input signal (d) of the VCO 3 can be expressed as follows:

$$V3 = Vref1 - V_{BE1} - R1 \cdot I1 \quad (1)$$

$$I1 = (Vref2 - V_{BE2})/R2 \quad (2)$$

wherein Vref1 and $V_{BE1}$ represent the base voltage and base-emitter voltage of the transistor Q1; Vref2 and $V_{BE2}$ represent those of the transistor Q2.

From the Formulas (1) and (2) above, the following equations are obtained:

$$V3 = Vref1 - V_{BE1} - (Vref2 - V_{BE2})R1/R2$$
$$V_{BE1} \approx V_{BE2} = V_{BE}$$
$$V3 = Vref1 - V_{BE} - (Vref2 - V_{BE})R1/R2 \quad (60)$$

Then, the temperature coefficient of the DC level V3 of the input signal (d) of the VCO 3 can be expressed as follows:

$$\frac{\partial}{\partial T} V3 =$$

-continued $$-\frac{\partial V_{BE}}{\partial T} + \frac{\partial V_{BE}}{\partial T} \cdot \frac{R1}{R2} = \left(\frac{R1}{R2} - 1\right) \frac{\partial V_{BE}}{\partial T}$$

Therefore, the temperature coefficient can be set as desired by adjusting the ratio between the resistance values of the resistors R1 and R2.

With the temperature coefficient of the constant voltage circuit 7 set at a negative value for the purpose of the temperature compensation for the VCO 3 and if one terminal (e) of each of the diodes D1 and D2 of a clamp circuit is fixed at a certain DC level as shown in FIG. 5, the waveform of the output signal (d) of PD 2, which is the input of the VCO 3, becomes as shown in FIG. 6(A) at a normal temperature, as shown in FIG. 6(B) at a high temperature, and as shown in FIG. 6(C) at a low temperature. In the case of FIG. 6(B), the difference between the control voltage $V_M$ of the free-running frequency $F_M$ and that of the high level frequency $F_H$ becomes smaller. The frequency pull-in range on the high level side also becomes narrower. In the case of FIG. 6(C), contrary to the case of FIG. 6(B), the difference from the control voltage $V_L$ of the low level frequency $F_L$ becomes smaller and the frequency pull-in range becomes narrower on the low level side.

The problem mentioned above can be solved by the provision of the sample-and-hold circuit 8 in the following manner: The DC level of the output signal (d) of the PD 2 is sampled and held by the sample-and-hold circuit 8 and is fed back to the terminal (e) of the diode. By this arrangement, the DC level of the output signal (d) of the PD 2 and the DC level of the terminal (e) can be adjusted to be in phase. The waveform of the signal (d) of the PD 2 is as shown in FIG. 7(A) in the case of normal temperature, as shown in FIG. 7(B) in the case of high temperature, and as shown in FIG. 7(C) in the case of low temperature. However, if the forward voltage of the diode D1 and that of the diode D2 are equal to each other, the difference between the value $V_H$, $V_{H1}$ or $V_{H2}$ and the value $V_L$, $V_{L1}$ or $V_{L2}$ can be kept unvarying for the control voltage $V_M$, $V_{M1}$ or $V_{M2}$ of the free-running frequency $F_M$ in all cases. The arrangement is thus capable of keeping the lock range of the PLL circuit unvarying against variations in temperature.

The circuit of FIG. 3, which is arranged according to this invention is described in the foregoing, is provided with a circuit for applying negative feedback of the DC component to the control signal at the first stage of the voltage controlled oscillator which forms the PLL circuit. Therefore, the invented PLL circuit has a high degree of stability and a wide phase lock pull-in range.

What is claimed is:
1. A phase locked loop circuit comprising:
 (a) a controllable oscillator;
 (b) phase difference detection means for detecting a phase difference between an output signal of said oscillator and an incoming signal; and
 (c) control signal generating means for generating a control signal to control an oscillation frequency of said oscillator on the basis of an output of said phase difference detection means, and wherein:
 said control signal is arranged to bring the oscillator frequency of said oscillator to a predetermined frequency, and said control signal is arranged to be generated at one of three levels including a first level, a second level which is higher than the first level and a third level which is lower than the first level; and said control signal generating means includes adjusting means for adjusting said first level to a value required for compensating for a temperature characteristic of said oscillator, and means for determining said second and third levels according to said first level which is adjusted by said adjusting means.

2. A circuit according to claim 1, wherein said adjusting means includes a constant voltage circuit which has a temperature characteristic corresponding to the temperature characteristic of said oscillator.

3. A circuit according to claim 1, wherein said determining means includes sampling means for sampling a DC level of said control signal.

4. A circuit according to claim 3, wherein said determining means includes two diodes; and said second and third levels are determined according to the DC level sampled by said sampling means and the forward levels of said two diodes.

5. A circuit according to claim 1, further comprising designating means for designating, at every repetition period of the incoming signal, a specific period during which the level of said control signal becomes said second or third level.

6. A circuit according to claim 5, wherein said control signal generating means further includes varying means for varying, according to the output of said phase difference detection means, a period during which the level of said control signal becomes said second or third level within said specific period.

7. A phase locked loop circuit comprising:
(a) a controllable oscillator;
(b) phase difference detection means for detecting a phase difference between an output signal of said oscillator and an incoming signal;
(c) control signal generating means for generating a control signal to control an oscillation frequency of said oscillator on the basis of an output of said phase difference detection means;
(d) feed-back means arranged to be connected to said control signal generating means, said feed-back means being arranged to control a level of said control signal on the basis of a DC level thereof; and
(e) designating means for designating, at every repetition period of said incoming signal, a specific period during which said oscillator is substantially controlled by said control signal.

8. A circuit according to claim 7, further comprising adjusting means for adjusting the level of said control signal according to a temperature characteristic of said oscillator during periods other than said specific period.

9. A device comprising:
(a) a controllable oscillator;
(b) phase difference detection means for detecting a phase difference between an output signal of said oscillator and an incoming signal;
(c) control signal generating means for generating a control signal to control an oscillation frequency of said oscillator on the basis of an output of said phase difference detection means;
(d) feed-back means arranged to be connected to said control signal generating means, said feed-back means being arranged to control a level of said control signal on the basis of a DC level thereof;
(e) designating means for designating, at every repetition period of said incoming signal, a specific period during which said oscillator is substantially controlled by said control signal; and
(f) means for compensating temperature characteristics of said oscillator.

10. A device according to claim 9, wherein said compensating means compensates the temperature characteristics of said oscillator by changing a state of said control signal from said control signal generating means.

11. A device according to claim 10, wherein said compensating means compensates the temperature characteristics of said oscillator by adjusting the level of said control signal from said control signal generating means.

* * * * *